Figure 1:
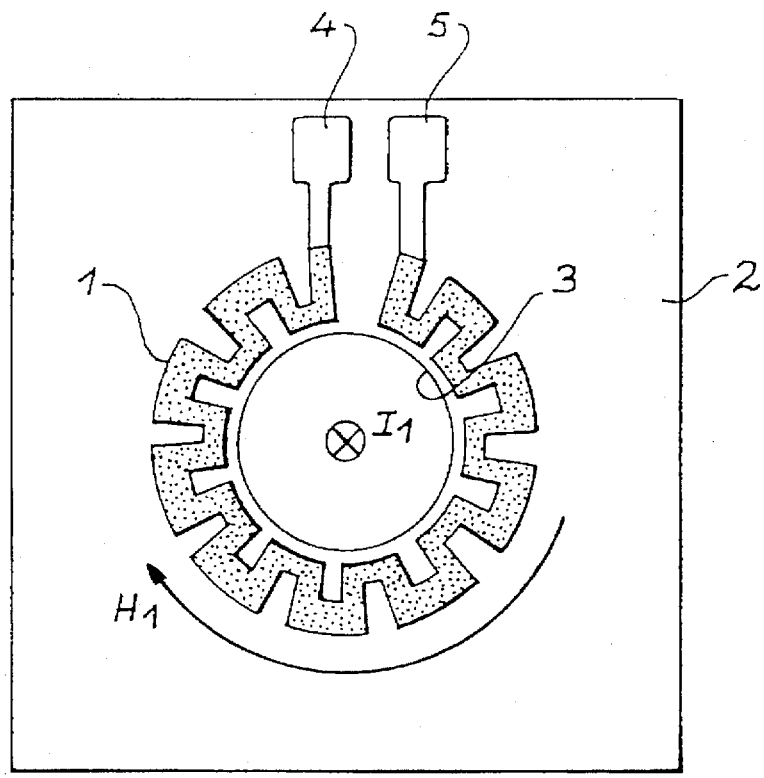

United States Patent [19]

Mouchot et al.

[11] Patent Number: 5,708,407
[45] Date of Patent: Jan. 13, 1998

[54] CURRENT SENSOR COMPRISING A MAGNETORESISTIVE TAPE AND ITS PRODUCTION PROCESS

[75] Inventors: Jean Mouchot, Grenoble; Jean-Marc Fedeli, Beaucroissant; Franck Boileau, Uriage; Patrick Mas, Fontaine, all of France

[73] Assignee: Commissariat a l'Energie Atomique, Paris, France

[21] Appl. No.: 619,640

[22] PCT Filed: Sep. 27, 1994

[86] PCT No.: PCT/FR94/01128

§ 371 Date: Aug. 23, 1996

§ 102(e) Date: Aug. 23, 1996

[87] PCT Pub. No.: WO95/09447

PCT Pub. Date: Apr. 6, 1995

[30] Foreign Application Priority Data

Sep. 27, 1993 [FR] France .................. 93 11442

[51] Int. Cl.$^6$ .......................... H01L 43/00; G01R 33/02
[52] U.S. Cl. .......................... 338/32 R; 324/252
[58] Field of Search .......................... 338/32 R; 324/252; 360/113

[56] References Cited

U.S. PATENT DOCUMENTS

| | | | |
|---|---|---|---|
| 3,813,692 | 5/1974 | Brock et al. | 338/32 R |
| 4,937,521 | 6/1990 | Yoshino et al. | |
| 4,949,039 | 8/1990 | Grunberg | |
| 5,134,533 | 7/1992 | Friedrich et al. | |
| 5,317,251 | 5/1994 | Haviland et al. | 360/113 |
| 5,523,687 | 6/1996 | Mouchot et al. | 324/252 |
| 5,585,775 | 12/1996 | Ishishita | 338/32 R |
| 5,592,082 | 1/1997 | Kuriyama | 338/32 R |

FOREIGN PATENT DOCUMENTS

| | | |
|---|---|---|
| 0300635 | 1/1989 | European Pat. Off. |
| 0381541 | 8/1990 | European Pat. Off. |
| 2648942 | 12/1990 | European Pat. Off. |
| 442407 | 8/1991 | European Pat. Off. |
| 0490327 | 6/1992 | European Pat. Off. |
| 3929452 | 3/1991 | Germany |

OTHER PUBLICATIONS

Patent Abstracts Of Japan–vol. 9, No. 156 (P–368) 29 Jun. 1985 & JP,A,60 031 014 (Sanyo Denki KK.) 16 Feb. 1985.

Patent Abstracts Of Japan—vol. 13, No. 280 (E–779) (3628) 27 Jun. 1989 & JP,A,01 067 987 (Sumitomo Special Metals Co Ldt).

IEEE Transactions On Magnetics, vol. 28, No. 5, Sep. 1992, "Giant Magnetoresistance: A Primer", Robert L. White.

Journal Of Magnetism And Magnetic Materials 118 (1993) L11–L16, North–Holland, "Magnetoresistive Properties and Therma Stability of Ni–Fe/Ag Multilayers", B. Rodmacq et al.

Applied Physics Letter, 60 (4), 27 Jan. 1992, "Oscillations in Giant Magnetoresistance and Antiferromagnetic Coupling in $[Ni_{81}Fe_{19}/Cu]_N$ Multilayers", S. S. P. Parkin.

IEEE Translation Journal On Magnetics In Japan, vol. 7, No. 9, Sep. 1992, "Magnetoresistance of Multilayers", H. Yamamoto et al.

*Primary Examiner*—Stuart N. Hecker
*Attorney, Agent, or Firm*—Pearne, Gordon, McCoy & Granger LLP

[57] ABSTRACT

The invention relates to a current sensor or transducer (10) for measuring the current flowing through an electric conductor (11), comprising a magnetoresistive tape (12) surrounding the conductor and whose ends (13, 14) are to be connected to a device for measuring said current, characterized in that the tape (12) is shaped like a tube with an axis centred on the conductor and in that it is formed with a multilayer, metallic, magnetic structure, whose layers constitute the same number of stacked elementary tubes concentric to said axis.

10 Claims, 5 Drawing Sheets

40 41 42 43

CURRENT SENSOR COMPRISING A MAGNETORESISTIVE TAPE AND ITS PRODUCTION PROCESS

The present invention relates to a current sensor comprising a magnetoresistive tape and to its production process. This sensor or transducer is to be used for measuring currents carried by electrical conductors. It can be used for the manufacture of ammeters, for the detection of threshold currents (maxima or minima) and for the detection of current losses by differential measurement between two sensors constructed in accordance with the invention.

Among current sensors, some make it possible to measure the current flowing in a circuit without having to insert a device in the actual circuit. They have the advantage of not modifying existing electrical arrangements. Their operating principle is based on the detection of the magnetic fields created by the passage of currents in the conductors.

Current sensors of this type are known, which use the magnetoresistive effect of certain materials for evaluating the value of the current flowing in a conductor by means of the magnetic field flowing round said conductor and generated by said current.

A material has a magnetoresistive effect as soon as its resistivity varies in the presence of a magnetic field. This variation is generally in the form of a reduction of the resistivity from a maximum value corresponding to an absence of magnetic field applied to a minimum value corresponding to a saturation magnetic field for said material. There is no further reduction to the resistivity of the material beyond the saturation magnetic field. Thus, the resistivity decrease zone offers the possibility of measuring electric currents.

U.S. Pat. No. 4,937,521 and DE-A-3 929 452 disclose current sensors using the magnetoresistive effect. The magnetoresistive component used is constituted by a single layer or film and is of the ferromagnetic type. It is generally formed from transition metal alloys (iron, nickel, cobalt). This component has an anisotropic magnetoresistive effect dependent on the angle existing between the magnetization direction of the material and the direction of the current made to flow in the magnetoresistive component. A bar-shaped magnetoresistive component has its magnetization generally aligned in parallel with the length of said bar. The resistivity of these components is then insensitive to magnetic fields applied in the same direction. Thus, these components have an anisotropic magnetoresistive effect. The magnetoresistive components of current sensors according to the prior art must be designed as a function thereof.

Thus, the magnetoresistive component of U.S. Pat. No. 4,937,521 has a winding shape, as shown in the attached FIG. 1. The magnetoresistive component 1 is deposited on a rigid, insulating substrate 2 perforated by a central hole 3, the component 1 being located around said hole. Its ends are connected to two contacts 4 and 5 permitting its linking with an external circuit having a magnetization and a measuring device detecting the resistivity variations of the component 1. The central hole 3 is used for the passage of the conductor, whereof the current flowing therethrough is to be measured. A current $I_1$ induces a magnetic field $H_1$. Only those parts of the component 1 transverse to the field $H_1$ will have their resistivity modified by the presence of the field $H_1$. The parts of component 1 parallel to the field $H_1$ will not undergo a resistivity modification.

The magnetoresistive component of DE-A-3 929 452 is based on a geometry comparable to that of the preceding document. The electrical parts parallel to the magnetic field are made from a non-magnetic, good conducting material. The parts transverse to the magnetic field are made from a magnetoresistive material and are partly covered with a system of conductive microtongues oriented at 45° from the axis of the magnetoresistive component.

Therefore the prior art magnetoresistive components suffer from the disadvantage that only one part of their structure implements the magnetoresistive effect. They are also produced on rigid supports limiting a collective production of the sensors.

In a field completely different from that of the present invention, namely the magnetic recording of data, use is made of magnetoresistive components known as multilayer, magnetic, metallic structures (MMMS's). The known MMMS's are formed from a stack of magnetic, metallic layers separated by non-magnetic, metallic layers, in which the thickness of the non-magnetic layers is such that there is an anti-ferromagnetic coupling between the magnetic layers. Under the effect of a magnetic field applied to the structure, the rotation from the anti-parallel state to the parallel state of the magnetizations of each of the magnetic layers is accompanied by a decrease in the electrical resistance of the structure, i.e. the magnetoresistive effect.

EP-A-442 407, FR-A-2 648 942 and U.S. Pat. No. 4,949,059 describe examples of applying these MMMS's to magnetic data recording.

Very significant magnetoresistive effects are observed in the following structures: Fe/Cr, Co/Cr, Fe/Cu, Co/Cu, Co/Ag. These observations are described in the following articles:

"Giant Magnetoresistance: A Primer" by Robert L. White, published in IEEE Transactions on Magnetics, vol. 28, No. 5, September 1992, p 2482, "Magnetoresistance of Multilayers" by H. Yamamoco and T. Shinjo, published in IEEE Translation Journal on Magnetics in Japan, vol. 7, No. 9, September 1992, pp 674–684.

Few structures have a high sensitivity associated with a quasi-zero hysteresis (criterion determining the magnetic reversibility). Hitherto, only FeNi/Cu and FeNi/Ag structures meet these two criteria and have formed the subject matter of the following articles: "Oscillations in Giant Magnetoresistance and Antiferromagnetic Coupling in $[Ni_{81}Fe_{19}/Cu]_N$ Multilayers" by S. S. P. Parkin, published in Appl. Phys. Lett., 60(4), 27 Jan. 1992, pp 512–514, "Magnetoresistive Properties and Thermal Stability of Ni—Fe/Ag Multilayers" by B. Rodmacq, G. Palumbo and Ph. Gerard, published in Journal of Magnetism and Magnetic Materials, 118, 1993, L11–L16.

In order to obviate the disadvantages of the prior art, magnetoresistive component current sensors (low magnetoresistive effect and anisotropic magnetoresistive effect), the present invention proposes replacing the conventionally used, monolayer, magnetoresistive components, multilayer, magnetoresistive components.

However, the MMMS's do not have the same magnetic characteristics (particularly an isotropic magnetoresistive effect) as monolayer magnetoresistors, so that the invention proposes a novel magnetoresistor geometry taking account of the characteristics in such a way as to bring about the optimum use thereof in the current sensor application. Moreover said MMMS's are advantageously produced on substrates, which can be deformed in such a way as to be windable around electrical conductors. In this case, the MMMS's are in a plane perpendicular to that of the prior art sensor magnetoresistors, said geometry favouring a collective production of the sensors.

Obviously, the use of MMMS's on a rigid substrate arranged according to the same plane as that of the prior art does not pass outside the scope of the invention.

The sensors according to the invention can advantageously be manufactured by means of microtechnologies.

Compared with ferromagnetic monolayers produced from transition metal alloys, the multilayer structures consequently have the advantage of an isotropic magnetoresistive effect, which does not take account of the angle existing between the magnetic field application direction and the direction taken by the current which is to flow in the magnetoresistive component when account is not taken of the demagnetizing field effects associated with the geometry of the component. It is therefore possible to apply the magnetic field corresponding to a current to be measured in a direction parallel to that of the current in the magnetoresistive component and obtain a variation of the intrinsic resistivity of the multilayer structure.

Thus, the invention relates to a current sensor or transducer for measuring the current flowing through an electric conductor, comprising a magnetoresistive tape surrounding the conductor and whose ends are to be connected to a device for measuring said current, characterized in that the tape is shaped like a tube with an axis centred on the conductor and in that it is formed with a multilayer, metallic, magnetic structure, whose layers constitute the same number of stacked elementary tubes concentric to said axis.

The tape can advantageously comprise means for the magnetic polarization of the metallic, multilayer, magnetic structure. The polarization of the magnetoresistor by means of a permanent magnetic field makes it possible to know the sign of the magnetic field induced by the current to be measured and consequently the direction of the current.

The tape can be formed by a sequence of metallic, multilayer, magnetic structure elements, two successive elements of the sequence being electrically interconnected by conductive, magnetic means forming the magnetic polarization means.

The tape can also be formed by a sequence of metallic, multilayer, magnetic structure elements, two successive elements of the sequence being electrically interconnected by conductive elements supporting the magnetic elements constituting the magnetic polarization means.

The magnetic elements constituting the polarization means are advantageously made from a hard, magnetic material, i.e. having a high coercivity.

The invention also relates to a process for the production of a current sensor incorporating a magnetoresistive tape having ends for connection to a device for measuring the current, characterized in that it comprises the following stages:

deposition on one face of an insulating substrate of a conductive, metallic layer, etching the conductive, metallic layer to form the ends of the tape, deposition of a conductive, magnetic material layer on said face, etching said conductive, magnetic material layer to obtain a sequence of aligned, separated, conductive, magnetic elements located between said ends, deposition on said face of a metallic, multilayer, magnetic structure layer, etching said metallic, multilayer, magnetic structure layer to obtain elements solely between the magnetic elements and so as to ensure the electrical continuity between said ends.

The invention also relates to a process for the production of a current sensor incorporating a magnetoresistive tape having ends to be connected to a device for measuring the current, characterized in that it comprises the following stages:

deposition on one face of an insulating substrate a conductive, metallic layer, etching the conductive, metallic layer to form the ends of the tape and a sequence of aligned, separated, conductive elements between said ends, deposition of a magnetic material layer on said face, etching said magnetic material layer to obtain a sequence of magnetic elements resting on the conductive elements, deposition on said face of a metallic, multilayer, magnetic structure layer, etching said metallic, multilayer, magnetic structure layer to obtain elements solely between the conductive elements and to ensure the electrical continuity between said ends.

The invention will be better understood and other advantages and features will become more apparent from reading the following description of a non-limitative embodiment relative to the attached drawings, wherein show:

FIG. 1 A magnetoresistive component of a prior art sensor.

Figure 2:
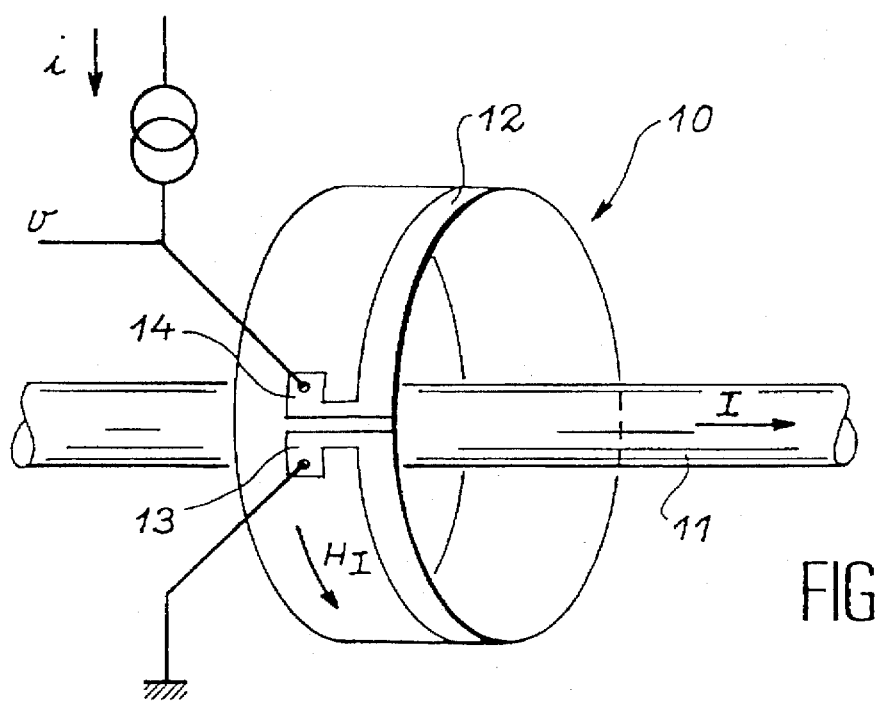

FIG. 2 A current sensor according to the invention.

Figure 3:
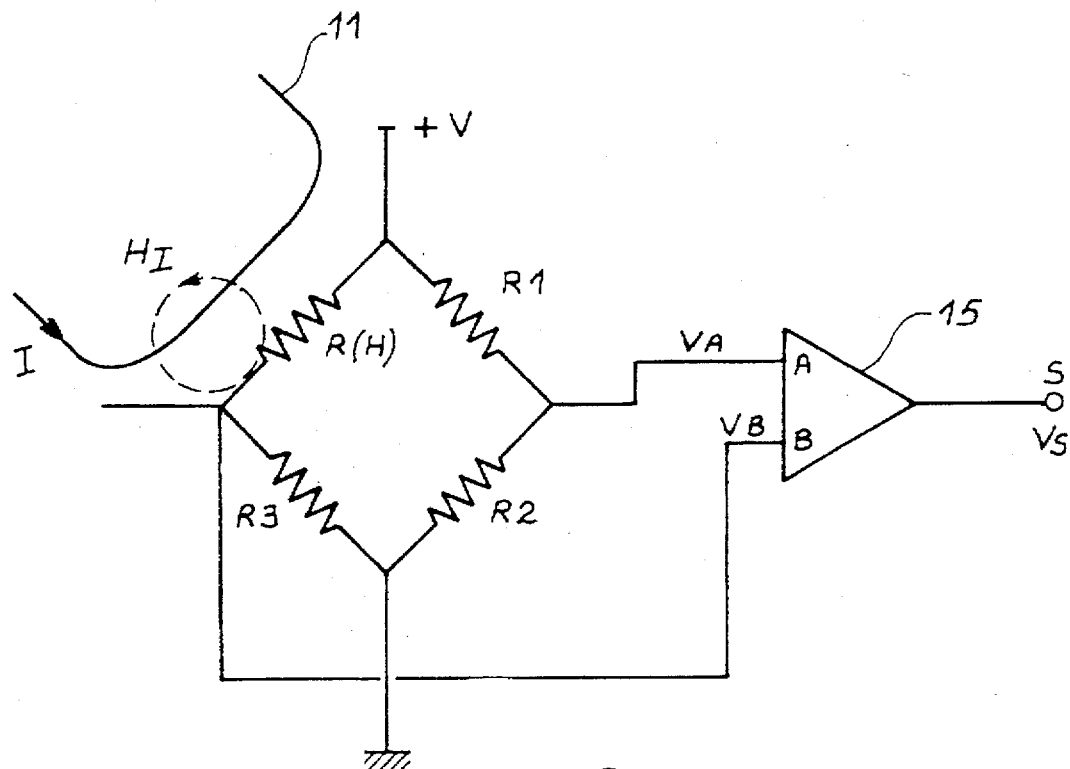

FIG. 3 In summary manner an electric circuit associated with the current sensor according to the invention and permitting the measurement of the current flowing through a conductor.

Figure 4:
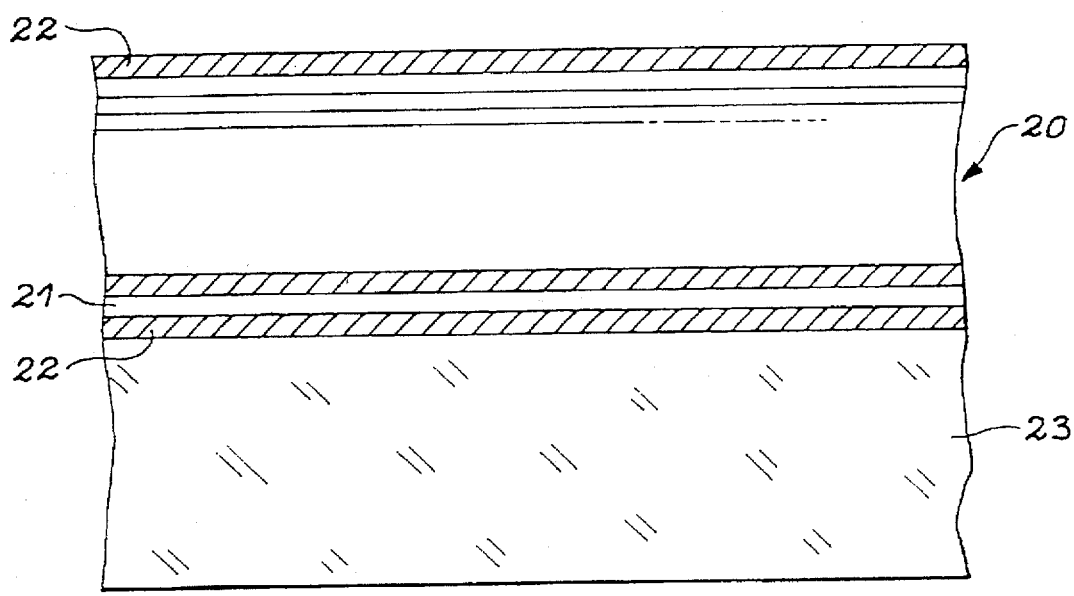

FIG. 4 Diagrammatically and in longitudinal section, part of a magnetoresistive tape usable by a current sensor according to the invention.

Figure 5:
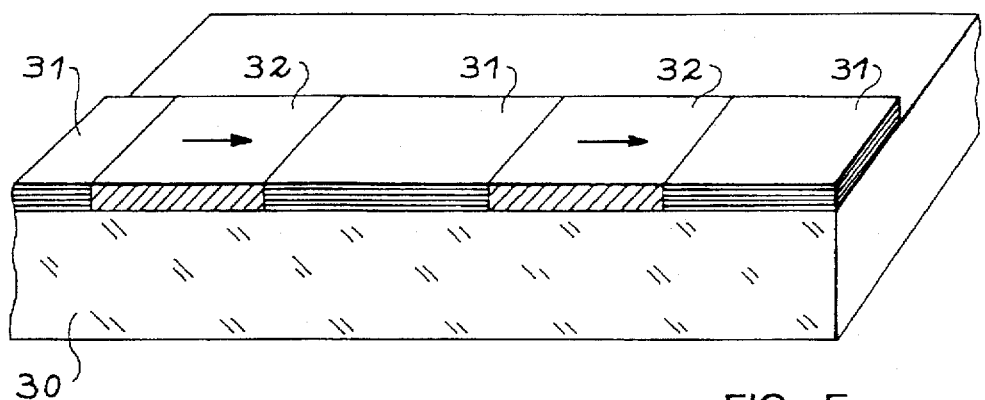

FIG. 5 In a first variant and in longitudinal section, part of a magnetoresistive tape with magnetic polarization of the magnetoresistor according to the invention.

Figure 6:
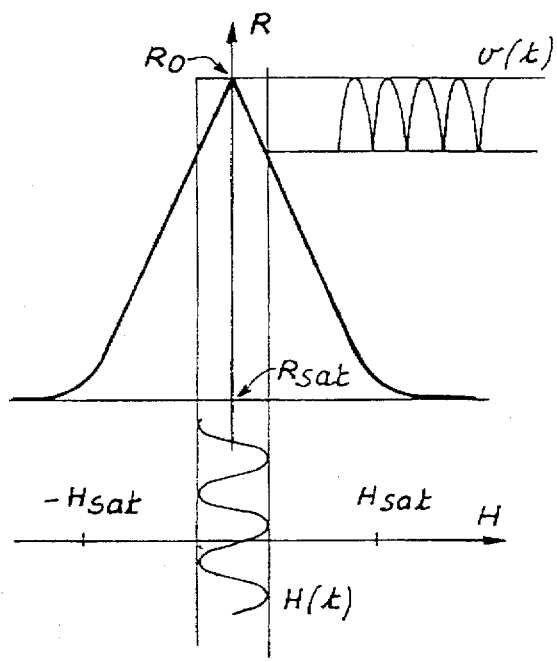
Figure 7:
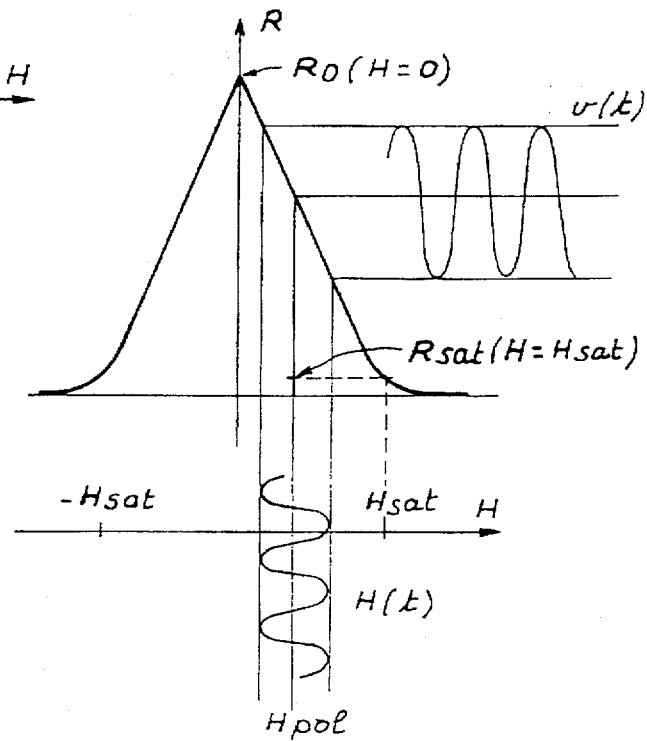

FIGS. 6 & 7 Explanatory diagrams respectively for a not magnetically polarized magnetoresistive tape and for a magnetically polarized magnetoresistive tape.

Figure 8:
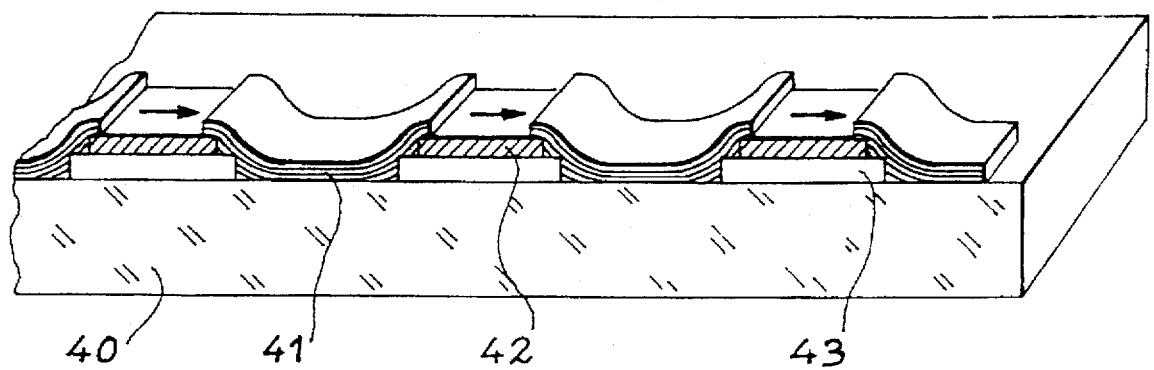

FIG. 8 As a second variant and in longitudinal section, part of a magnetically polarized magnetoresistive tape of the magnetoresistor according to the invention.

Figure 9:
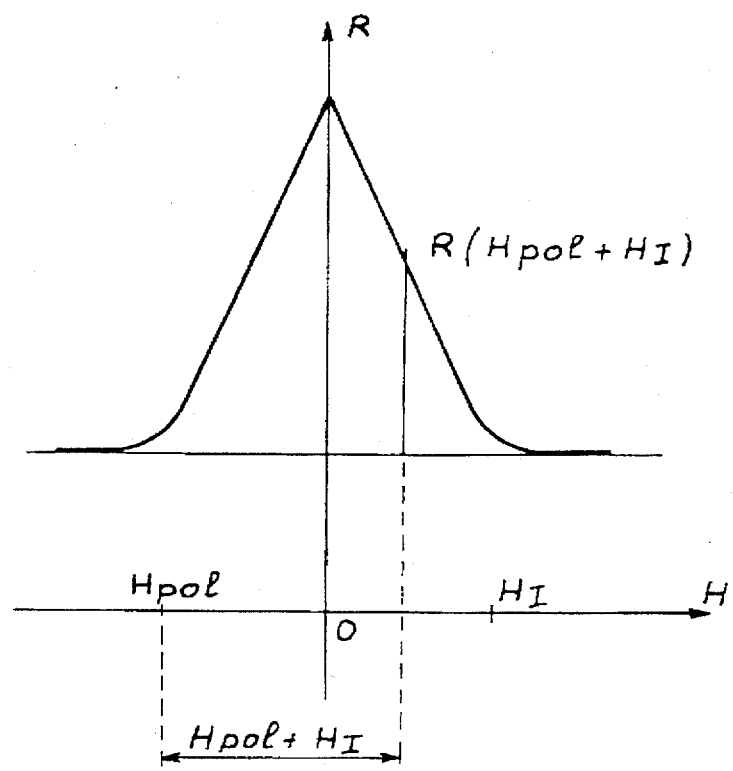

FIG. 9 A diagram explaining a magnetoresistive tape polarized in a special way.

Figure 10:
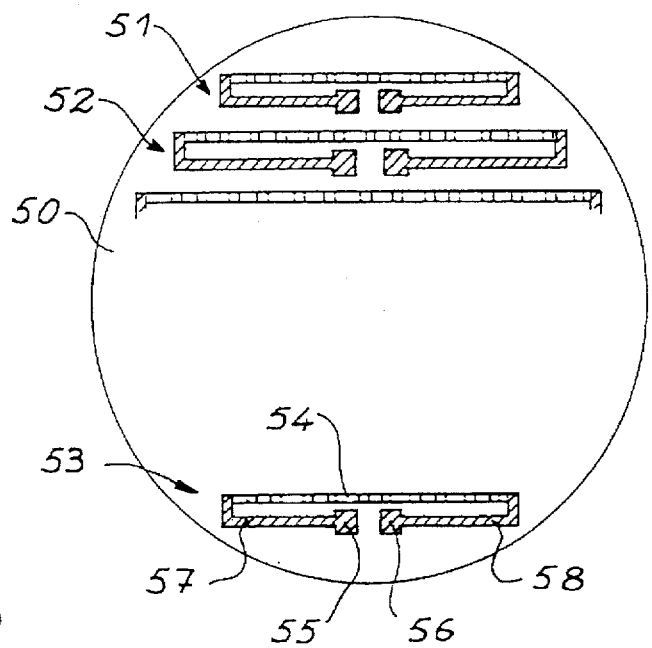

FIG. 10 A possibility for the collective production of the current sensors according to the invention.

Figure 11:
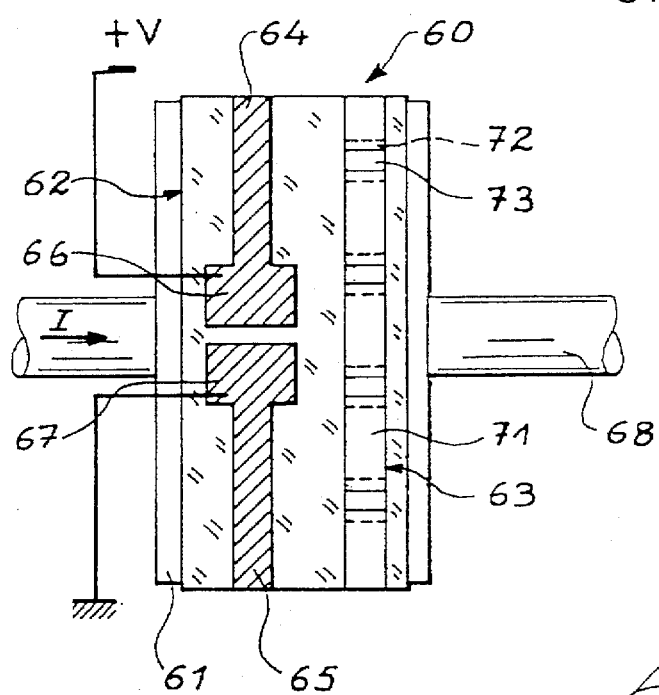

FIG. 11 A current sensor according to the invention.

Figure 12:
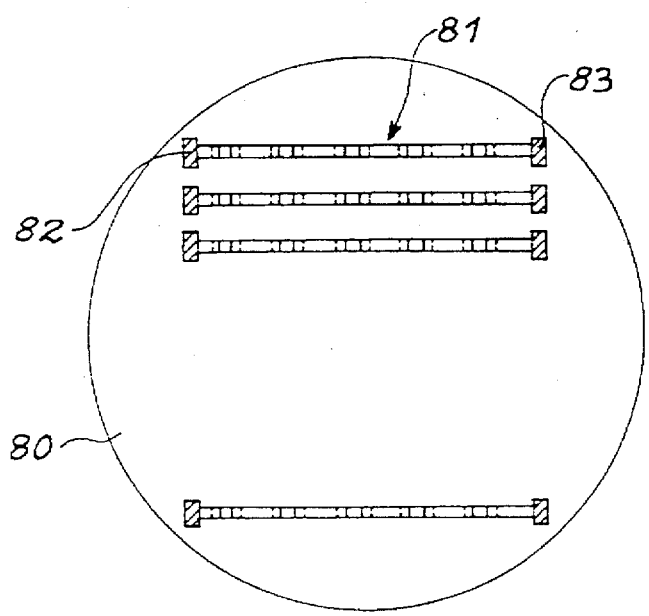
Figure 2:
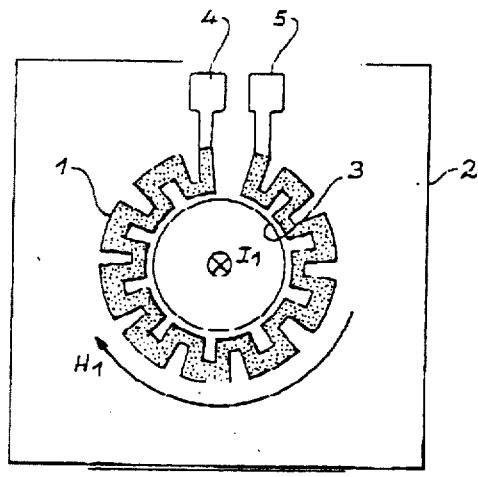
Figure 2:
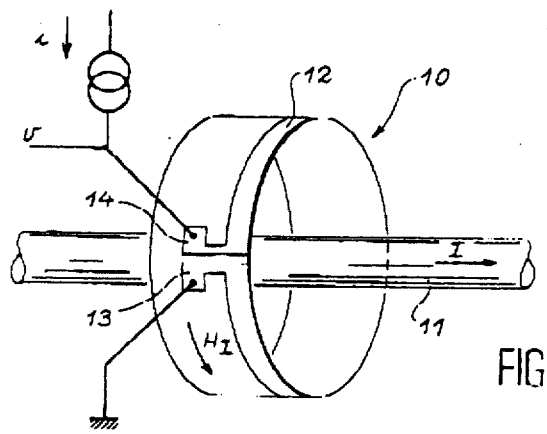

FIG. 12 Another possibility for the collective production of the current sensors according to the invention.

FIG. 2 shows a current sensor 10 according to the invention in the position for measuring the current I flowing through the electrical conductor 11. The ring-shaped current sensor or transducer 10 has a ring-shaped, magnetoresistive tape 12. The ends 13 and 14 of the tape 12 are in the vicinity of one another in such a way that the tape forms an almost complete circle. Its ends are so arranged as to permit the electrical connection of the tape 12 to a direct current i (or voltage) generator. The observation of the voltage v at the terminal ends of the tape 12 makes it possible to establish the variation of the resistance of the tape under the effect of the magnetic field $H_I$ induced by the current I.

FIG. 3 shows in summary form an example of an electric circuit permitting the measurement of the current I flowing through the conductor 11. The magnetoresistive tape, diagrammatically represented by its resistance R(H) is integrated into a Wheatstone bridge, having the other resistors $R_1$, $R_2$ and $R_3$. The bridge is supplied by a voltage V. The output of the bridge is connected to the input of a differential amplifier 15. By choosing the values of $R_1$ and $R_2$, it is possible to fix the value of the potential at the input A of the amplifier 15. The variations of R(H) are reflected by the potential obtained at the input B of the amplifier 15, $R_3$ also being selected. This amplifier supplies an output signal at S proportional to the potential difference at its inputs, i.e. proportional to the current I.

The expert is aware of electric measuring circuits other than that illustrated in FIG. 3 and in particular those described in U.S. Pat. No. 4,937,521.

The current sensor can be produced using microtechnology procedures. It can be produced from a flat substrate, which is wound or bonded to a circular support in order to surround the conductor. Thus, in this case the substrate must be deformable. It can be formed from a sheet or foil of steel, stainless material, etc. and covered with an electrically insulating film. It is also possible to use a plastics material such as PVC, polyurethane or polyester. It is also possible to use a polyimide. Typically the substrate thickness is between 10 and 100 µm.

The magnetoresistive tape can be formed, as shown in FIG. 4, by a stack 20 of magnetic layers 21 separated by metallic, non-magnetic layers 22 on a substrate 23.

The variant of FIG. 5 was produced from an insulating substrate 30 on which was deposited a magnetoresistive tape constituted by an alternation of elements 31 having a metallic, multilayer, magnetic structure (MMMS) and conductive, magnetic elements 32, which make it possible to electrically connect the MMMS's 31. They are advantageously made from a hard magnetic material. The electrical resistance of this magnetoresistive component is the sum of the resistances of the MMMS's 31 and conductive elements 32. It is clear that the conductive elements 32 increase the total resistance of the magnetoresistive component and decrease its magnetoresistive effect, because their resistivity does not vary as a function of the magnetic field applied. It is therefore of interest to minimize the resistance of the conductive elements 32, e.g. by increasing their section (width and thickness).

By orienting the magnetization of each of the conductive, magnetic elements 32 in the same direction, there is a polarization magnetic field within the MMMS elements 31. This has the advantage of making it possible to know the sign of the current I to be measured, as will be explained relative to FIGS. 6 and 7.

The diagrams or graphs of FIGS. 6 and 7 show the evolution of the voltage v at the terminal ends of the magnetoresistive tape as a function of the magnetic field H induced by an alternating current flowing through the conductor, around which is placed the current sensor. The magnetoresistive tape is traversed by a direct current I having a constant amplitude supplied by a current generator. FIGS. 6 and 7 show the curve R of the evolution of the resistance of the magnetoresistive tape as a function of the magnetic field H applied. The resistance varies from a maximum value $R_o$ for H=0 to a minimum value $R_{sat}$ for higher or equal magnetic fields, in absolute values, compared with the saturation field $H_{sat}$. The voltage v=R·i collected at the terminal ends of the magnetoresistive tape will consequently vary in relation to the curve R.

FIG. 6 relates to the case of a not magnetically polarized, magnetoresistive tape. If the conductor, whereof the current flowing therein is to be measured, is traversed by an alternating current, it will induce about it an alternating magnetic field. Therefore the magnetoresistive tape will be subject to a magnetic field H(t), like that shown in FIG. 6. The voltage v collected will consequently vary between a maximum value $R_o$·i (for H=0) and a minimum value corresponding to a maximum amplitude of a positive or negative alternation of H(t). In the absence of magnetic polarization, a magnetoresistor doubles the oscillation frequency of the magnetic excitation. It is then not possible to determine the sign of H and therefore the sign of the current I to be measured.

FIG. 7 relates to the case of a magnetoresistive tape magnetically polarized by a permanent field $H_{pol}$, like that produced by magnetic elements 32 (cf. FIG. 5). In this case, the measured signal is of the same period as the magnetic excitation and the sign of H (i.e. the direction of the current) can be established.

By choosing highly coercive, hard material, magnetic elements, it is possible, after placing them in an intense magnetic field (exceeding their coercive field) to orient the magnetization parallel to the length of the tape. Due to their location, the magnetic elements will generate a polarization field within the MMMS elements parallel to the tape length.

The variant shown in FIG. 8 differs from that of FIG. 5 in that between the MMMS's 41 deposited on the insulating substrate 40 are deposited non-magnetic, conductive elements 43 supporting magnetic elements 42, which can therefore be non-conductive or poorly conductive. This solution offers various advantages compared with the previous solution. It ensures the best possible electric connection between the MMMS's. Thus, the most conductive materials, such as copper and silver are not magnetic and can consequently not be used in the variant of FIG. 5, but can be used in the present case. Moreover, the elements 42 are advantageously made from hard, magnetic material.

The use of particularly hard material, magnetic elements, can be useful for measuring high currents. Thus, in the presence of high currents (I>1000 A), the magnetic excitation $H_I$ can become close to and even exceed the saturation field $H_{sat}$ of the magnetoresistor. It is then advantageous to orient the magnetization of the magnetic elements in the direction opposite to that of the magnetic field applied to the magnetoresistive tape. This more particularly applies in the case of direct currents or having a limited variation around their nominal value. This is illustrated in FIG. 9, which is a graph having on the ordinate the value R of the magnetoresistive tape and on the abscissa the value of the magnetic field H applied. The magnetic polarization field $H_{pol}$ is negative, so that it is possible to correctly measure the currents I inducing a magnetic field $H_I$ of a value such that in the absence of a magnetic polarization field said measurement could not have taken place. However, it is necessary to ensure that the magnetic fields $H_{pol}$, $H_I$ and $H_{pol}+H_I$ are below the coercive field of the hard, magnetic elements. This avoids any risk of progressive demagnetization of the magnetic elements.

In practice, it is necessary to prove that $H_I<H_c/10$ in which $H_c$ is the coercive field. Around $R(H_{pol}+H_I)$, it is possible to measure the resistance of R(H) and thus determine the value of the current. It is possible to define a minimum resistance $R_{min}$ and a maximum resistance $R_{max}$ corresponding to the magnetic fields $H_{min}$ and $H_{max}$ beyond which the current to be measured is considered to be too high or too low respectively.

On choosing an opposite field $H_{pol}$, but equal in absolute value to the field $H_I$ induced by a given current I, any reduction in the resistance would correspond to an abnormal operation (overintensity or underintensity). Thus, it is possible to produce the essential component of a circuit-breaker.

The group of magnetic or non-magnetic, conductive elements (cf. FIGS. 5 and 8) must have the lowest possible resistance. It is therefore necessary to minimize their length and choose a good conducting material, i.e. its resistivity must be low compared with that of the MMMS material. The thickness of the conductive elements must be at a maximum, without disturbing the technological stack in the case of the variant of FIG. 8. Typically a conductive material thickness between 0.1 and 3 µm is chosen. This conductive material can be copper or gold with a tungsten, chromium, tantalum or similar fastening underlayer.

Preference will be given to the choice of a metallic, magnetic, multilayer structure with a high magnetoresistance. As a function of the intensity of the currents to be measured, the saturation field must be higher or lower if it can be chosen. For example, if it is wished to measure currents in a range up to 100 A on the basis of a magnetoresistive element wound onto a support so as to form a device with a diameter equal to 1 cm, the aim will be a metallic, magnetic, multilayer structure with a saturation field of at least 3.5 kA/m. The length, width and thickness of the magnetoresistive elements must be chosen so as to obtain a relatively high resistance compared with that of conductive elements. Typically, the resistance of the tape is between 100 Ω and 100 kΩ and preferably between 1 and 10 kΩ. Thus, the supply of the magnetoresistive tape can be from a commercially available current or voltage generator.

The choice of the lengths of the MMMS elements and the conductive elements is guided by the polarization field which it is wished to impose in the MMMS elements and by the minimization of the electrical resistance of the conductive elements.

The higher the coercivity of the magnetic material, the more the progressive demagnetization risks are reduced. For magnetic fields to be measured of approximately 4 kA/m, it is appropriate to use a magnetic material which e.g. proves the relation $H_c > 40$ kA/m.

The dimensions of the magnetic polarization elements and the distance separating them can be such that the polarization field which they induce is equal to that sought. The conductive elements below the magnetic elements have at least the same length as the latter. These geometrical parameters are obviously dependent on the value of the residual magnetization of the hard, magnetic material and the magnetic permeability of the MMMS elements. The higher the permeability, the more numerous the magnetic flux lines intercepted by the magnetoresistor and the higher will be the magnetic polarization field.

It will now be shown how it is possible to determine the value of the current I flowing in a conductor around which is wound in circular manner the magnetoresistive tape according to the invention. The magnetic field H flowing in the magnetoresistive tape wound in circular manner is defined by the relation H=I/L, in which L is the tape length. The calculation will be made for the most complicated case, i.e. when the magnetoresistive tape is of the type shown in FIG. 8.

The magnetoresistive tape has the following resistance $$R(H) = R_{cond} + R_{mult}(H)$$

in which $R_{cond}$ represents the resistance of the conductive elements 43 and $R_{mult}(H)$ represents the resistance of the MMMS elements 41, which is dependent on the magnetic field H applied. On considering that the magnetoresistance is linear between H=0, for which $R_{mult}=R_{mult}(H=0)$, and $H=H_{sat}$ or $-H_{sat}$, for which $R_{mult}=R_{mult}(H=H_{sat})$ we obtain for $H<H_{sat}$:

$$R(H) = R_{cond} + R_{mult}(H=0) \left[ 1 - \frac{\Delta R}{R_{mult}(H=0)} \times \frac{H}{H_{sat}} \right]$$

with $\Delta R = R(H=0) - R(H=H_{sat})$.

$H > H_{sat}$, we have the relation:

$$R(H) = R_{cond} + R_{mult}(H=H_{sat}).$$

For a measuring circuit like that shown in FIG. 3, the voltages $V_A$ and $V_B$ are as follows:

$$V_A = \frac{R_2}{R_1 + R_2} \times V \quad V_B = \frac{R_3}{R_3 + R(H)} \times V$$

hence:

$$V_A - V_B = \frac{R_2 \cdot R(H) - R_3 \cdot R_1}{(R_1 + R_2)(R_3 + R(H))} \times V$$

By choosing $R_1$, $R_2$ and $R_3$ in such a way that $R_3 \cdot R_1 = R_2 \cdot R(H=0)$, we obtain:

$$V_A - V_B = \frac{R_2 \times \Delta R}{(R_1 + R_2)(R_3 + R(H))} \times \frac{1}{H_{sat}} \times \frac{I}{L} \times V$$

As a first approximation and if G is the gain of the amplifier 15, we obtain at the output S:

$$V_S = -\frac{R_2 \times \Delta R}{(R_1 + R_2)(R_3 + R(H=0))} \times \frac{G}{H_{sat}} \times \frac{I}{L} \times V$$

From this is drawn the value of the current I.

A description will now be given of the technological implementation of a current sensor according to FIG. 8. The substrate 40 is introduced into a vacuum enclosure for the deposition of a conductive material layer. Said layer is then etched to form the conductive elements 43 and the tape ends for ensuring the connections to the measuring device. This is followed by the deposition of an advantageously hard, magnetic material layer, which is then also etched so as to form the magnetic elements 42 on the conductive elements 43. This is followed by the deposition of a metallic, multilayer, magnetic material layer by cathodic sputtering or vapour deposition of targets necessary for its production. Etching then again takes place to obtain the MMMS elements 41. The structure obtained can then be covered with a protective film, provided that the ends of the magnetoresistive tape are freed to ensure the electrical connections. The thus obtained structure is then subject to the action of an intense magnetic field to orient the magnetization of the magnetic elements 42 in the desired direction.

On the basis of the same circular substrate, it is thus possible to produce a large number of current sensors. The plan view of FIG. 10 shows such a structure. The substrate 50 supports a large number of magnetoresistive tapes according to the invention and the tapes 51, 52 . . . 53 can be of different lengths. In this embodiment, the active parts of the magnetoresistors, such as part 54 of tape 53, are connected to the ends of the tapes, such as the ends 55 and 56 of the tape 53 by connections produced from the first deposited, conducted layer, such as the connections 57 and 58 of the tape 53.

Each tape is then cut with its corresponding substrate part in order to form a strip, which will be placed on a circular support surrounding the conductor, whose current is to be measured. FIG. 11 shows a current sensor 60 obtained in this way. The sensor 60 comprises a circular support 61 to which has been fixed, e.g. by bonding the strip 62. Said strip has a magnetoresistive tape 63 connected by connections 64 and 65 to ends 66 and 67. The current sensor 60 is shown in FIG. 11 in the measuring position around the conductor 68. It is possible to see on the tape 63 the MMMS elements and the conductive elements 72 on which are deposited the magnetic elements 73.

In the plan view of FIG. 12, the substrate 80 also supports a large number of identical, magnetoresistive tapes 81. In this embodiment, the tapes are directly connected to the ends 82 and 83 without connecting elements. This design makes it possible to reduce to the minimum the resistance of the non-magnetoresistive parts of the tapes.

We claim:

1. Current sensor or transducer for measuring the current flowing through an electric conductor, comprising a magnetoresistive tape surrounding the conductor and whose ends are to be connected to a device for measuring said current, in which the tape is shaped like a tube with an axis centered on the conductor and that it is formed with a multilayer, metallic, magnetic structure, whose layers constitute the same number of stacked elementary tubes concentric to said axis.

2. Current sensor according to claim 1, wherein the tape has means for the magnetic polarization of the metallic, multilayer, magnetic structure.

3. Current sensor according to claim 2, wherein the tape has a sequence of metallic, multilayer, magnetic structure elements, two successive elements of the sequence being electrically interconnected by magnetic, conductive elements constituting said magnetic polarization means.

4. Current sensor according to claim 2, wherein the tape has a sequence of metallic, multilayer, magnetic structure elements, two successive elements of the sequence being electrically interconnected by conductive elements supporting magnetic elements constituting the said magnetic polarization means.

5. Current sensor according to claim 4, wherein, in order to reduce the resistance of the magnetoresistive tape due to the conductive elements, the section of said conductive elements, considered in a plane perpendicular to the tape length, exceeds the section, also considered in a plane perpendicular to the tape length, of metallic, multilayer, magnetic structure elements.

6. Current sensor according to claim 2, wherein said magnetic polarization means are produced from a hard, magnetic material.

7. Current sensor according to claim 1, wherein it is constituted by a circular support, to which is fixed the magnetoresistive tape.

8. Process for the production of a current sensor incorporating a magnetoresistive tape having ends for connection to a device for measuring the current, comprising the following stages:

deposition on one face of an insulating substrate of a conductive, metallic layer, etching the conductive, metallic layer to form the ends of the tape, deposition of a conductive, magnetic material layer on said face, etching said conductive, magnetic material layer to obtain a sequence of aligned, separated, conductive, magnetic elements located between said ends, deposition on said face of a metallic, multilayer, magnetic structure layer, etching said metallic, multilayer, magnetic structure layer to obtain elements solely between the magnetic elements and so as to ensure the electrical continuity between said ends.

9. Process for the production of a current sensor incorporating a magnetoresistive tape having ends to be connected to a device for measuring the current, comprising the following stages:

deposition on one face of an insulating substrate a conductive, metallic layer, etching the conductive, metallic layer to form the ends of the tape and a sequence of aligned, separated, conductive elements between said ends, deposition of a magnetic material layer on said face, etching said magnetic material layer to obtain a sequence of magnetic elements resting on the conductive elements, deposition on said face of a metallic, multilayer, magnetic structure layer, etching said metallic, multilayer, magnetic structure layer to obtain elements solely between the conductive elements and to ensure the electrical continuity between said ends.

10. Process according to either of the claims 8 and 9, wherein the insulating substrate used can be deformed.

* * * * *

UNITED STATES PATENT AND TRADEMARK OFFICE
CERTIFICATE OF CORRECTION

PATENT NO. : 5,708,407
DATED : January 13, 1998
INVENTOR(S) : Jean Mouchot et al It is certified that error appears in the above-indentified patent and that said Letters Patent is hereby corrected as shown below:

In the drawings, replace sheet 1 of 5 with the attached sheet 1 of 5, which indicates FIG. 1 as prior art.

Column 2, line 25, delete "4,949,059" and insert --4,949,039--; and line 34, delete "H. Yamamoco" and insert --H. Yamamoto--.

Column 5, line 10, delete "procedures," and insert --procedures.--.

Column 7, line 16, delete "magnetic,.multilayer" and insert --magnetic, multilayer--.

Column 8, line 6, before "H>H" insert --For--.

Column 9, line 5, after "elements" insert --71--.

Signed and Sealed this

Sixteenth Day of June, 1998

Attest:

BRUCE LEHMAN

*Attesting Officer*    *Commissioner of Patents and Trademarks*

PRIOR ART  FIG. 1